United States Patent
Yoshimura

(10) Patent No.: US 7,199,467 B2
(45) Date of Patent: Apr. 3, 2007

(54) SEMICONDUCTOR DEVICE WITH IMPROVED HEAT DISSIPATION, AND A METHOD OF MAKING SEMICONDUCTOR DEVICE

(75) Inventor: Hideaki Yoshimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 114 days.

(21) Appl. No.: 10/772,252

(22) Filed: Feb. 6, 2004

(65) Prior Publication Data

US 2004/0164402 A1 Aug. 26, 2004

(30) Foreign Application Priority Data

Feb. 21, 2003 (JP) .............................. 2003-044335

(51) Int. Cl.
*H01L 23/34* (2006.01)
(52) U.S. Cl. ................................ 257/712; 257/E23.08
(58) Field of Classification Search ................ 257/712, 257/713
See application file for complete search history.

(56) References Cited

U.S. PATENT DOCUMENTS

| | | | |
|---|---|---|---|
| 5,527,604 A | | 6/1996 | Hayashi |
| 5,637,925 A | | 6/1997 | Ludden et al. |
| 5,763,950 A | | 6/1998 | Fujisaki et al. |
| 5,981,085 A | * | 11/1999 | Ninomiya et al. .......... 428/614 |
| 6,127,724 A | | 10/2000 | DiStefano |
| 6,281,575 B1 | * | 8/2001 | Nishikawa et al. ......... 257/707 |
| 6,391,442 B1 | * | 5/2002 | Duvall et al. ............... 428/348 |
| 6,462,952 B1 | | 10/2002 | Ubukata et al. |
| 6,486,562 B1 | * | 11/2002 | Kato ........................... 257/778 |
| 6,504,723 B1 | * | 1/2003 | Fitzgerald et al. .......... 361/705 |
| 6,667,548 B2 | * | 12/2003 | O'Connor et al. .......... 257/712 |
| 7,030,485 B2 | * | 4/2006 | Houle et al. ................. 257/712 |
| 7,056,566 B2 | * | 6/2006 | Freuler et al. .............. 428/40.1 |
| 2001/0028110 A1 | | 10/2001 | Andoh |
| 2002/0031918 A1 | | 3/2002 | deRochemont et al. |
| 2003/0127727 A1 | * | 7/2003 | Suehiro et al. ............. 257/712 |

FOREIGN PATENT DOCUMENTS

| | | |
|---|---|---|
| FR | 2 813 146 | 2/2002 |
| JP | 57176750 A | 10/1982 |
| JP | 60094744 | 5/1985 |
| JP | 01117049 A | 5/1989 |
| JP | 02121332 | 5/1990 |
| JP | 10050770 A | 2/1998 |
| JP | 10-303340 A | 11/1998 |

(Continued)

OTHER PUBLICATIONS

European Search Report for Application No. EP 04 25 0449 dated Apr. 19, 2004.

*Primary Examiner*—David A. Zarneke
(74) *Attorney, Agent, or Firm*—Westerman, Hattori, Daniels & Adrian, LLP.

(57) ABSTRACT

A semiconductor device includes a semiconductor chip, a heat dissipation member for dissipating heat generated by the semiconductor chip, and a coupling member which thermally couples the semiconductor chip to the heat dissipation member, wherein the coupling member is made of metal and deformable to absorb a stress generated between the semiconductor chip and the heat dissipation member, the coupling member and the semiconductor chip being joined through metal-metal bonding.

9 Claims, 9 Drawing Sheets

FOREIGN PATENT DOCUMENTS

| | | |
|---|---|---|
| JP | 11067998 A | 3/1999 |
| JP | 2001-110951 A | 4/2001 |
| JP | 2001-345405 A | 12/2001 |
| JP | 2003-273294 A | 9/2003 |
| JP | 2003-282631 A | 10/2003 |

* cited by examiner

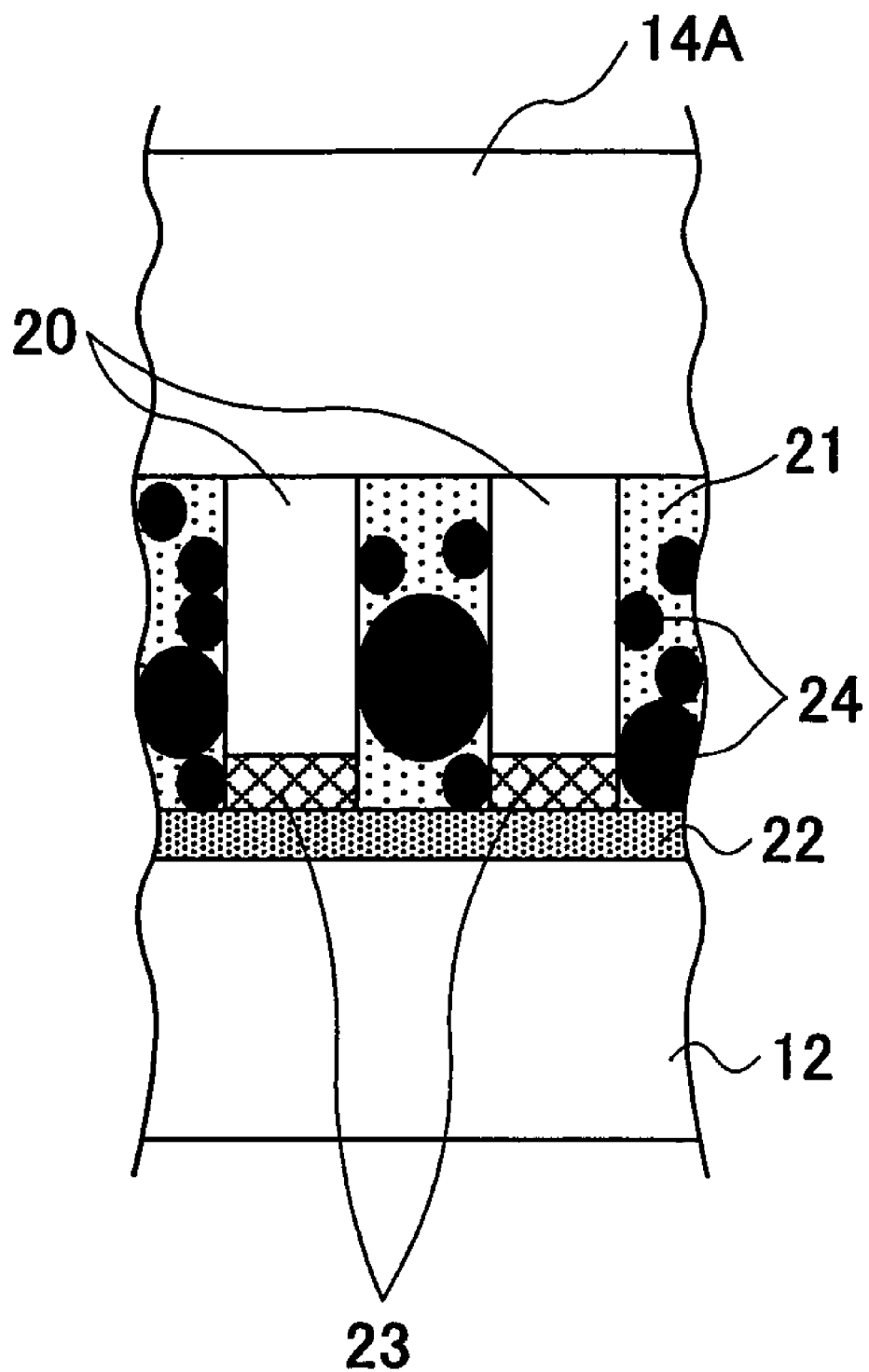

SEMICONDUCTOR DEVICE WITH IMPROVED HEAT DISSIPATION, AND A METHOD OF MAKING SEMICONDUCTOR DEVICE

CROSS-REFERENCE TO RELATED APPLICATIONS

The present application is based upon and claims the benefit of priority from the prior Japanese Patent Application No. 2003-044335 filed on Feb. 21, 2003, with the Japanese Patent Office, the entire contents of which are incorporated herein by reference.

BACKGROUND OF THE INVENTION

1. Field of the Invention

The present invention generally relates to semiconductor devices and methods of making the semiconductor devices, and particularly relates to a semiconductor device and a method of making the semiconductor device in which the efficiency of heat dissipation regarding heat generated by a semiconductor chip is improved.

2. Description of the Related Art

In recent years, the circuit integration of semiconductor chips has been further enhanced, and there has been a demand for higher density for the implementation of semiconductor devices. Against this background, BGA-type semiconductor devices and LGA-type semiconductor devices, which achieve shorter pitches for external connection terminals (bumps, lands, etc.) compared with QFP (quad flat package)-type semiconductor devices, have been attracting attention, and have been put to practical use.

Moreover, the heat radiation of semiconductor devices increases as the circuit integration of semiconductor chips are further enhanced, resulting in a need to improve heat dissipation characteristics of semiconductor devices.

Various related-art semiconductor devices have been proposed that shorten the pitches of external connection terminals and improve heat dissipation characteristics (for example, Patent Document 1–4). FIG. 1 is an illustrative drawing showing an example of a related-art semiconductor device which is aimed at improving heat dissipation characteristics. A semiconductor device 1 shown in FIG. 1 has an FC-BGA (flip-chip bump grid-array package) structure, and schematically includes a semiconductor chip 2, a package substrate 3, a heat dissipation member 4, and solder balls 5.

The semiconductor chip 2 is mounted through flip-chip implementation on the upper surface of the package substrate 3. The solder balls 5 serving as external connection terminals are provided on the lower surface of the package substrate 3. The package substrate 3 is a multi-layered substrate, and the semiconductor chip 2 and the solder balls 5 are electrically coupled through internal wiring.

The heat dissipation member 4 serves as a lid that protects the semiconductor chip 2, and also serves as a heat dissipation plate that dissipates heat generated by the semiconductor chip 2. Because of this, the semiconductor chip 2 and the heat dissipation member 4 need to be thermally coupled. In the related art, a thermal coupling member 6 (hereinafter simply referred to as a coupling member) is used to provide thermal coupling between the back surface of the semiconductor chip 2 and the interior surface of the heat dissipation member 4.

In such a structure, two schemes as described in the following are typically employed as a heat conduction mechanism that conducts heat from the back surface of the semiconductor chip 2 to the heat dissipation member 4.

One of the schemes (scheme (a)) is to use a heat conductor such as grease (compound) or a heat conductive adhesive that has stress relaxation characteristics, and provide such heat conductor as the coupling member 6 between the semiconductor chip 2 and the heat dissipation member 4 in order to prevent the lowering of reliability that is caused by a mismatch of the coefficient of thermal expansion resulting from the differences of materials between the semiconductor chip 2 and the heat dissipation member 4. The other scheme (scheme (b)) is to provide a material (e.g., a composite material of Cu—W, carbon, and aluminum, etc.) having the coefficient of thermal expansion close to that of the semiconductor chip 2, thereby connecting between the semiconductor chip 2 and the heat dissipation member 4 through soldering.

[Patent Document 1]
Japanese Patent Publication No. 57-176750

[Patent Document 2]
Japanese Patent Publication No. 01-117049

[Patent Document 3]
Japanese Patent Publication No. 10-050770

[Patent Document 4]
Japanese Patent Publication No. 11-067998

In the scheme (a) described above, either grease (compound) or a heat conductive adhesive has high thermal resistance, giving rise to a problem in that thermal conduction from the semiconductor chip 2 to the heat dissipation member 4 is not efficiently carried out. In the scheme (b) described above, the composite material of Cu—W, carbon, and Al or the like is used as a material having the coefficient of thermal expansion close to that of the semiconductor chip 2. Such material has relatively low thermal conductivity, compared with Cu or the like that has satisfactory heat dissipation characteristics. Because of this, the scheme (b) can only be used for a package in which heat generation by the semiconductor chip 2 is relatively low.

Accordingly, there is a need for a semiconductor device and a method of making the semiconductor device wherein heat generated by the semiconductor device is reliably dissipated, and, also, stress generated inside the device is reduced.

SUMMARY OF THE INVENTION

It is a general object of the present invention to provide a semiconductor device and a method of making the semiconductor device that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor device and a method of making the semiconductor device particularly pointed out in the specification in such full, clear, concise, and exact terms as to enable a person having ordinary skill in the art to practice the invention.

To achieve these and other advantages in accordance with the purpose of the invention, the invention provides a semiconductor device, including a semiconductor chip, a heat dissipation member for dissipating heat generated by the semiconductor chip, and a coupling member which thermally couples the semiconductor chip to the heat dissipation member, wherein the coupling member is made of metal and deformable to absorb a stress generated between the semiconductor chip and the heat dissipation member, the coupling member and the semiconductor chip being joined through metal-metal bonding.

In the invention described above, a stress generated between the semiconductor chip and the heat dissipation member is absorbed by the coupling member, so that the stress applied to the semiconductor chip is reduced, thereby improving the reliability of the semiconductor device. Further, metal-metal bonding between the coupling member and the semiconductor chip enhances thermal conductivity between the coupling member and the semiconductor chip, which achieves efficient heat dissipation with respect to heat generated by the semiconductor chip.

According to another aspect of the invention, the semiconductor device as described above further includes a metal layer formed on the semiconductor chip in a place where the coupling member is joined to the semiconductor chip through the metal-metal bonding.

In the invention described above, the metal layer is formed on the semiconductor chip in a place where the coupling member is joined to the semiconductor chip, thereby providing secure bonding between the coupling member and the semiconductor chip.

According to another aspect of the invention, the coupling member includes a plurality of posts that are deformable.

In the invention described above, the deformable posts can reliably absorb a stress generated between the semiconductor chip and the heat dissipation member.

According to another aspect of the invention, the semiconductor device as described above further includes an organic material filling gaps between the posts.

In the invention described above, the organic material filling the gaps between the posts reinforces the joints between the coupling member and the semiconductor chip, thereby improving the reliability of joints between the coupling member and the semiconductor chip.

According to another aspect of the invention, the organic material is mixed with an inorganic material, the mixture of the organic material and the inorganic material having a coefficient of thermal expansion between a coefficient of thermal expansion of the semiconductor chip and a coefficient of thermal expansion of the heat dissipation member.

In the invention described above, the inclusion of the inorganic material provides a coefficient of thermal expansion between that of the semiconductor chip and that of the heat dissipation member, thereby reducing a stress that is applied to the semiconductor chip by the organic material.

According to another aspect of the invention, the posts have varying lengths, which are longer at a perimeter than at a center of the coupling member. According to another aspect of the invention, the posts have varying cross-sectional areas, which are smaller at a perimeter than at a center of the coupling member. According to another aspect of the invention, the posts arranged with varying layout density, which is lower at a perimeter than at a center of the coupling member.

In the invention described above, the coupling member has higher rigidity near the center where a smaller stress is generated, and has lower rigidity to provide elasticity near the perimeter where a larger stress is generated. In this manner, the posts are given elasticity commensurate with the strength of a stress, thereby reliably absorbing the stress generated between the semiconductor chip and the heat dissipation member in an efficient manner.

According to another aspect of the invention, the coupling member is integral with the heat dissipation member.

In the invention described above, the construction of the semiconductor chip can be simplified.

According to another aspect of the invention, a method of making a semiconductor device, includes the steps of making a coupling member by forming posts on a substrate, forming a metal layer on a back surface of a semiconductor chip, pressing the posts against the metal layer while filling a resin material between the coupling member and the semiconductor chip, thereby joining the posts to the metal layer through metal-metal bonding.

In the invention described above, the process of joining the posts to the metal layer and the process of filling the gaps between the posts with the resin material are simultaneously performed, thereby simplifying the method of making the semiconductor device.

Other objects and further features of the present invention will be apparent from the following detailed description when read in conjunction with the accompanying drawings.

BRIEF DESCRIPTION OF THE DRAWINGS

FIG. 4 is an illustrative drawing showing a resin material mixed with a filler;

DESCRIPTION OF THE PREFERRED EMBODIMENTS

In the following, embodiments of the present invention will be described with reference to the accompanying drawings.

Figure 1:
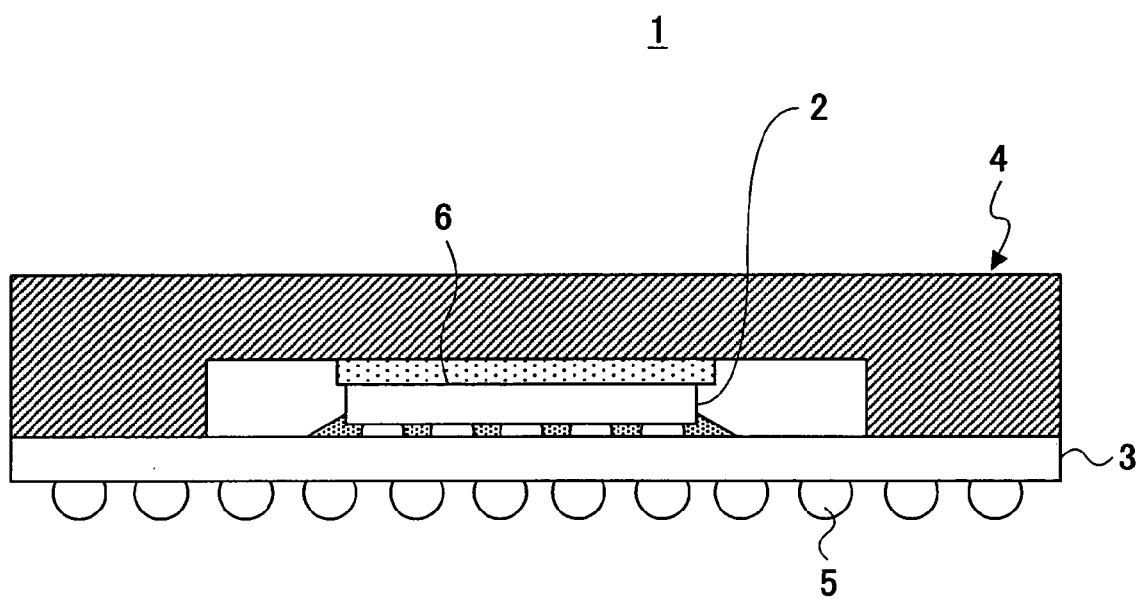
FIG. 1 is an illustrative drawing showing an example of a related-art semiconductor device which is aimed at improving heat dissipation characteristics.
Figure 2:
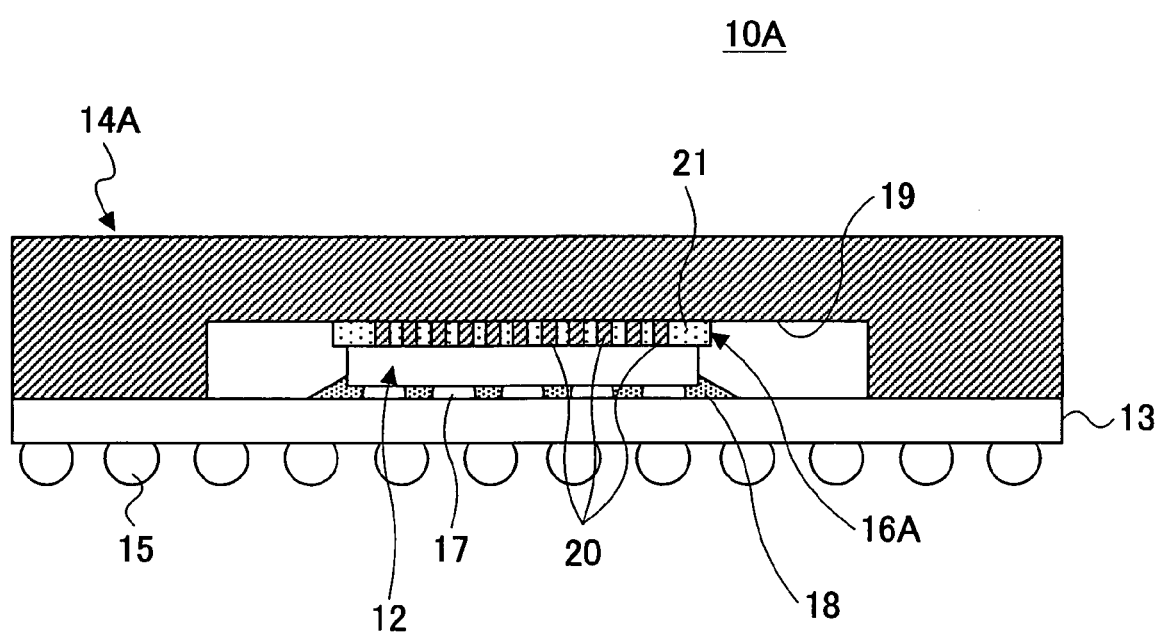
FIG. 2 is an illustrative drawing showing a semiconductor device according to a first embodiment of the invention.

FIG. 2 is an illustrative drawing showing a semiconductor device 10A according to a first embodiment of the invention. The semiconductor device 10A shown in FIG. 2 has an FC-BGA structure, and schematically includes a semiconductor chip 12, a package substrate 13, a heat dissipation member 14A, solder balls 15, and a coupling member 16A.

The semiconductor chip 12 is mounted through flip-chip implementation by use of bumps 17 on the upper surface of the package substrate 13. Between this semiconductor chip 12 and the package substrate 13, underfill resin 18 is provided in order to prevent the stress resulting from different thermal expansion between the semiconductor chip 12 and the package substrate 13 from being concentrated on the bumps 17. Moreover, as shown in an expanded view of FIG. 3, a metal layer 22 is formed on the back surface of the semiconductor chip 12. Posts 20, which will be later described, are connected to the metal layer 22 through a joint material 23.

The solder balls 15 serving as external connection terminals are provided on the lower surface of the package substrate 13. The package substrate 13 is a multi-layered substrate, and the semiconductor chip 12 and the solder balls 15 are electrically coupled through internal wiring.

The heat dissipation member 14A is made of copper (Cu), aluminum (Al), a composite material using these materials as a base, or a carbon composite material, each of which has satisfactory thermal conductivity. In this embodiment, Cu is used as the material of the heat dissipation member 14A. In order to avoid surface oxidization, the heat dissipation member 14A may have its surface coated by anti-oxidization film.

The heat dissipation member 14A serves as a lid that protects the semiconductor chip 12, and also serves as a heat dissipation plate that dissipates heat generated by the semiconductor chip 12. To this end, the heat dissipation member 14A has a cavity 19, in which the semiconductor chip 12 and the coupling member 16A are situated.

Since the heat dissipation member 14A serves as a heat dissipation plate for dissipating heat generated by the semiconductor chip 12, the semiconductor chip 12 and the heat dissipation member 14A need to be thermally coupled. In this embodiment, the thermal coupling member 16A (hereinafter simply referred to as a coupling member) is used to provide thermal coupling between the semiconductor chip 12 and the heat dissipation member 14. With this provision, heat generated by the semiconductor chip 12 is conducted by the coupling member 16A to the heat dissipation member 14A, which then releases the heat.

The coupling member 16A of this embodiment includes a plurality of posts 20 integrally formed with the heat dissipation member 14A, and also includes a resin material 21 provided in gaps between the posts 20. The posts 20 are formed integrally with the heat dissipation member 14A, so that they are made of Cu that has high thermal conductivity. Since Cu is easy to deform, the pots 20 are also to deform.

The height of the posts 20 is determined by taking into account a stress applied to the joints between the posts 20 and the semiconductor chip 12 and heat conduction from the semiconductor chip 12 to the heat dissipation member 14A. The height may be about 30 micrometers to 100 micrometers. The diameter and pitch of the posts 20 are determined by taking into account required heat resistance and the required reliability (life) of the coupling member.

Heat resistance is inversely proportional to the density of the posts 20 (i.e., the number of the posts 20 per unit area) and the cross-sectional area of the posts 20. The reliability is determined by the difference of thermal expansion between the heat dissipation member 14A and the semiconductor chip 12, the amount of heat generation by the semiconductor chip 12, etc. In general, the reliability is inversely proportional to the diameter of the posts 20 to the n-th power (about 2nd to 3rd power), the difference of the coefficients of thermal expansion to the m-th power (about second power), and the height of the posts 20 to the L-th power (about second power).

The resin material 21 may be a BT-resin-system material, an epoxy-system material, a silicon-system material, or the like. As previously described, the resin material 21 fills the gaps between the posts 20. In this manner, the resin material 21 successfully reinforces the joints between the posts 20 and the semiconductor chip 12, thereby increasing the reliability of joints between the coupling member 16A and the semiconductor chip 12.

If a BT-resin system material, an epoxy-system material, or a silicon-system material is used without any treatment, the coefficient of thermal expansion of the resin material 21 becomes extremely large compared with that of the semiconductor chip 12. As a result, a stress may be generated between the semiconductor chip 12 and the resin material 21 when the semiconductor device 10A is heated (e.g., at the time of mounting).

In order to avoid this, the BT-resin-system material, the epoxy-system material, or the silicon-system material, which is used as a raw material for the resin material 21, may be mixed with a filler 24 that is comprised of inorganic material, as shown in FIG. 4. As a result, the resin material 21 having the filler 24 mixed therein may have the coefficient of thermal expansion that is between the coefficient of thermal expansion of the semiconductor chip 12 and the coefficient of thermal expansion of the heat dissipation member 14A. As this filler 24, $SiO_2$ powder or $Al_2O_3$ powder may be used. Alternatively, granular $SiO_2$ or granular $Al_2O_3$ may be used for the purpose of lowering viscosity.

With the filler 24 mixed in the resin used as a raw material for the resin material 21, the coefficient of thermal expansion of the resin material 21 is set between the coefficient of thermal expansion of the semiconductor device 12 and the coefficient of thermal expansion of the heat dissipation member 14A, thereby preventing a stress from being applied to the semiconductor chip 12 due to the provision of the resin material 21. Further, the mixing of the filler 24 having high heat conductivity (i.e., low heat resistance) into the resin material 21 allows the resin material 21 to conduct heat generated by the semiconductor chip 12 to the heat dissipation member 14A.

According to the semiconductor device 10A of this embodiment described above, a stress caused by the different coefficients of thermal expansion between the semiconductor chip 12 and the heat dissipation member 14A is reliably absorbed when the posts 20 constituting the coupling member 16A are deformed. As a result, the stress applied to the semiconductor chip 12 is reduced, thereby improving the reliability of the semiconductor device 10A.

Moreover, the metal connection between the posts 20 and the semiconductor chip 12 (i.e., the metal layer 22) improves thermal conductivity between the posts 20 and the semiconductor chip 12, resulting in efficient heat dissipation as heat is generated by the semiconductor chip 12. Further, this embodiment provides the coupling member 16A (i.e., the posts 20) that is formed integrally with the heat dissipation member 14A, which provides for the structure of the semiconductor device 10A to be simplified.

In the following, a method of manufacturing the semiconductor device 10A as described above will be described. It should be noted that the method of manufacturing the semiconductor device 10A according to the invention is characterized in the method of forming the coupling member 16A and in the method of thermally connecting the coupling member 16A (i.e., the posts 20) to the semiconductor chip 12. Other steps of the manufacturing process may be the same as those of the conventional art. In the following description of the method of manufacturing, a description will only be given of the method of forming the coupling member 16A and the method of connecting the coupling member 16A to the semiconductor chip 12.

Figure 5A:
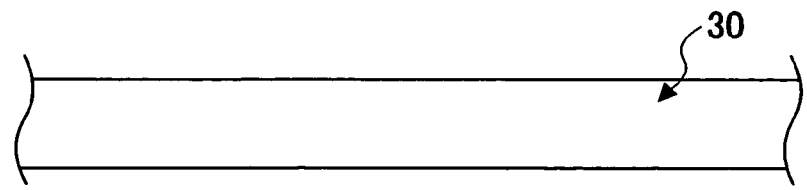
FIGS. 5A through 5K are illustrative drawings showing a method of manufacturing the semiconductor device of the invention.

For the purpose of manufacturing the coupling member 16A, a heat dissipation member base material 30 as shown in FIG. 5A is provided. Since the method of manufacturing the semiconductor device 10A shown in FIG. 2 is taken as an example for the purpose of explanation, the heat dissipation member base material 30 is regarded as the heat dissipation member 14A for which the posts 20 have yet to be formed.

Figure 5B:
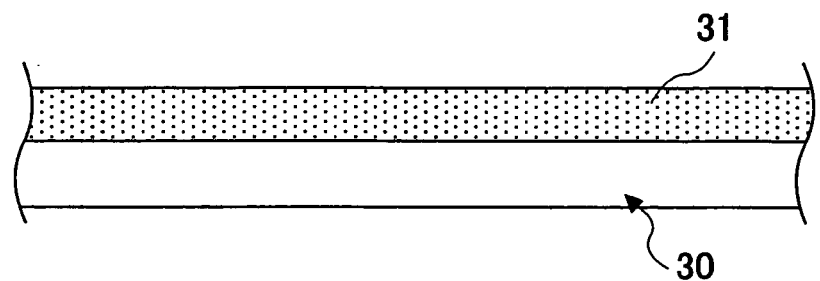
Figure 5C:
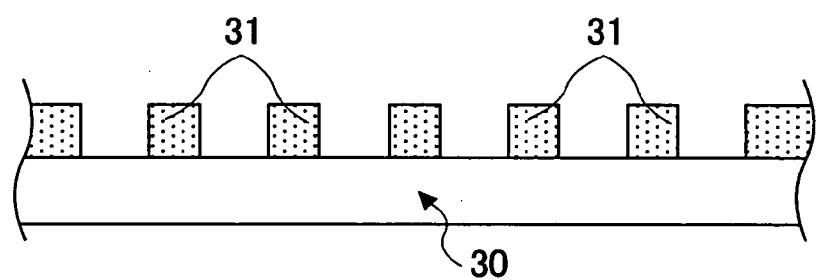

A resist 31 is formed on the heat dissipation member base material 30 as shown in FIG. 5B. Then, as shown in FIG. 5C, the resist 31 is partially removed in places where the posts 20 are to be formed. The removal of the resist 31 is performed by a wet process such as the exposure of photosensitive resist material and the removal of resist or a dry process such as ion milling.

Figure 5D:
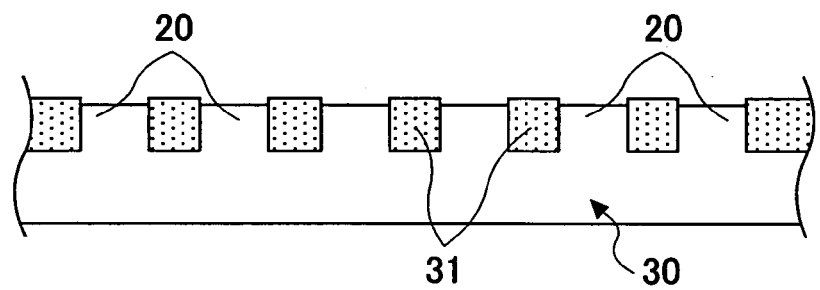

When the resist 31 is partially removed at the position of posts, Cu is electroplated, thereby forming the posts 20 on the heat dissipation member base material 30 as shown in FIG. 5D. As previously described, the heat dissipation member base material 30 is the heat dissipation member 14A, and is made of Cu. The heat dissipation member base material 30 is thus used as an electrode to form the posts 20 through electroplating.

The height of the posts 20 made of Cu can be controlled by the duration of electroplating. As previously described, the height of the posts 20 is determined by taking into account a stress applied to the joints between the posts 20 and the semiconductor chip 12 and thermal conduction from the semiconductor chip 12 to the heat dissipation member 14A. The height may be about 30 micrometers to 100 micrometers.

Figure 5E:
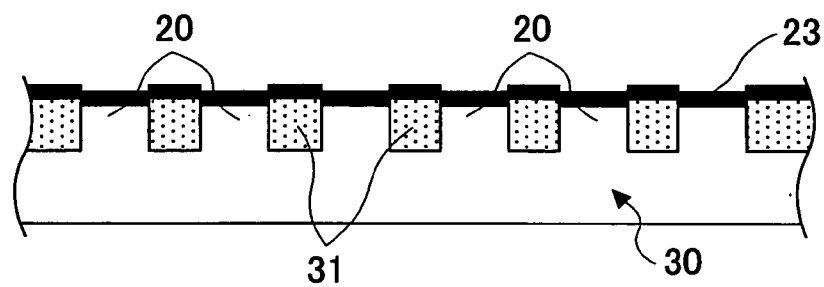

After the posts 20 are formed on the heat dissipation member base material 30 as described above, the joint material 23 for metal connection with the semiconductor chip 12 is formed on the entirety of the upper surface of the heat dissipation member base material 30 (i.e., the entire surface including the posts 20 and the resist 31) as shown in FIG. 5E. The joint material 23 is mainly comprised of Sn or the like, and may as well be a typical Sn—Pb solder material or the like. The joint material 23 may be formed by a plating method to a thickness of about 3 micrometers to 5 micrometers, for example. When the joint material 23 is formed, alternatively, the joint material 23 may be selectively provided only on the upper surface of the posts 20.

Figure 5F:
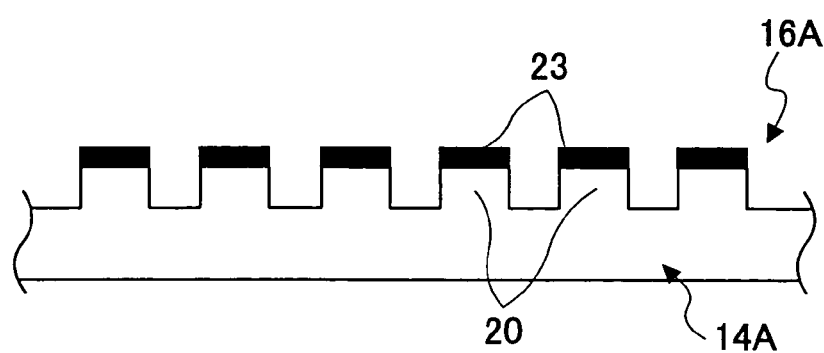

After the completion of the posts 20, the resist 31 (inclusive of the joint material 23 on the resist 31) used for the formation of the posts 20 is removed. The formation of the coupling member 16A (i.e., the posts 20) is thereby completed as shown in FIG. 5F. With the completion of the coupling member 16A, the posts 20 and the coupling member 14A form an integral and unitary structure according to this embodiment.

In the following, a description will be given of a method of thermally connecting the heat dissipation member 14A to the semiconductor chip 12 by use of the coupling member 15A manufactured in the manner described above.

Figure 5G:
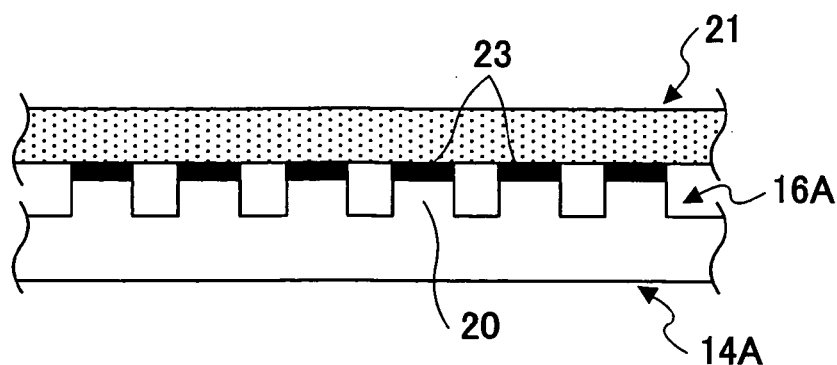
Figure 5H:
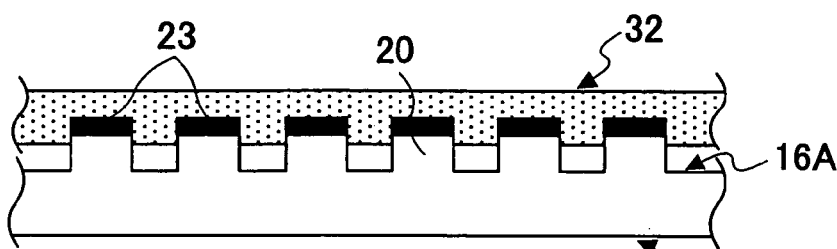

In order to thermally connect the heat dissipation member 14A to the semiconductor chip 12, as shown in FIG. 5G, the resin material 21 having a sheet form is laid out on the top of the posts 20 which constitute the coupling member 16A. The resin material 21 has the filler 24 already mixed therein. Preparatory heating is then carried out, thereby temporarily fixing the sheet-like resin material 21 to the coupling member 16A, as shown in FIG. 5H. During this process, heating and pressurizing for the fixing is performed in vacuum in order to avoid the creation of voids due to the inadvertent inclusion of bubbles. If a BT resin is used as the resin material 21, for example, temporal fixing is performed at 70 degrees Celsius, 10 torr, and 10 kg/cm$^2$.

Moreover, the posts 20 will be connected to the semiconductor chip 12 by penetrating through the resin material 21, as will be later described. Because of this, the designing of viscosity of the resin material 21 prior to curing and the designing of the filler 24 content are important factors to be considered when selecting materials for the resin material 21, thereby avoiding the drop of heat resistance of the posts 20 caused by the remains of the resin material 21 and the filler 24 at the tip of the posts 20. To be specific, if the posts 20 have a diameter of 60 micrometer to 70 micrometer, the viscosity is designed such that a minimum viscosity of the resin material 21 prior to curing is lower than or equal to 5000 cps (centipoise). The filler (SiO2) content in this case is lower than or equal to 20%, and the coefficient of thermal expansion is about 60 ppm.

Figure 5I:
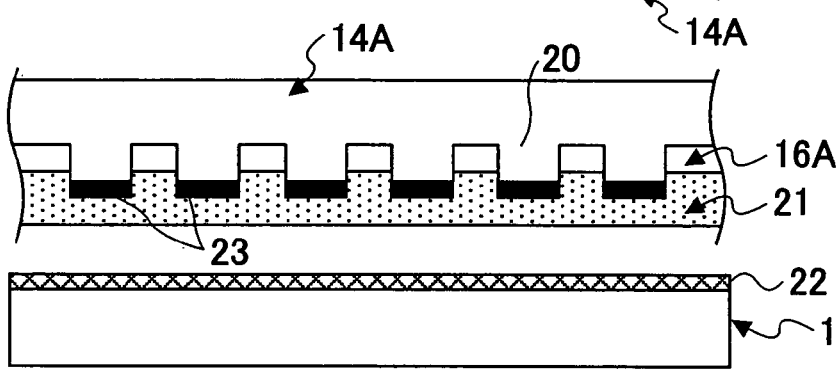

After the resin material 21 is temporarily fixed to the coupling member 16A, the coupling member 16A is positioned above the semiconductor chip 12, with the surface of the resin material 21 facing downward, as shown in FIG. 5I. By this time, the metal layer 22 has already been formed on the back surface of the semiconductor chip 12. Cu, Au, or the like may be used as the metal layer 22. In order to form the metal layer 22, a titanium (Ti) film to serve as an adhesion metal is first formed on the back surface of the semiconductor chip 12 to a thickness of 5000 angstroms, and an Au layer is then formed on the top to a thickness of 0.3 micrometers.

Figure 5J:
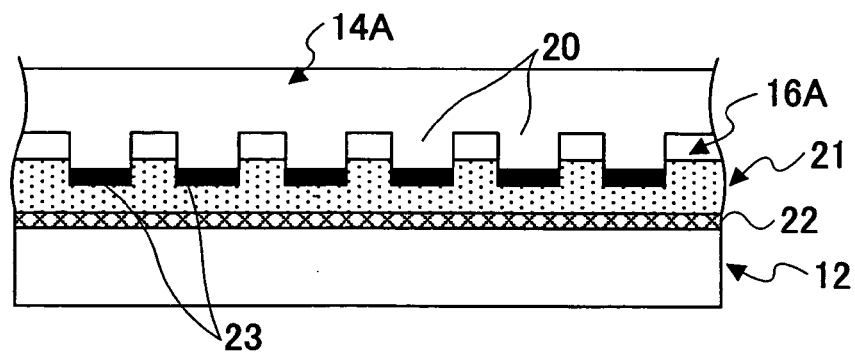

Thereafter, a process is performed to provide metal-metal bonding that joins the coupling member 16A to the semiconductor chip 12, as shown in FIG. 5J. To be specific, the joint material 23 formed at the tip of the posts 20 is connected through metal-metal bonding to the metal layer 22 formed on the back surface of the semiconductor chip 12.

The process for providing metal-metal bonding that joins the posts 20 to the metal layer 22 is performed by an apparatus equipped with an anti-oxidization function and a pressurization function.

In this embodiment, a vacuum press apparatus is used as the apparatus having these two functions. When Au is used as the metal layer 22, the joining conditions are as follows. A pressure is set to less than about 30 kg/cm$^2$, and the posts 20 are joined to the metal layer 22 in approximately one second at a temperature of 230 degrees Celsius to 240 degrees Celsius. When Cu is used as the metal layer 22, a pressure is set approximately to 5 kg/cm$^2$ to 10 kg/cm$^2$, and heating at a temperature of 250 degrees Celsius is performed for 30 minutes in order to turn fragile Sn$_3$Cu into stable Sn$_6$Cu$_5$.

The purpose of heating is to provide secure contact at the joint between the posts 20 and the metal layer 22, and also to avoid the generation of voids by squashing Kirkendall voids that are generated at the time of Au—Sn diffusion and Cu—Sn diffusion. Moreover, it also serves to securely fill the gaps of the posts 20 with the resin material 21.

Figure 5K:
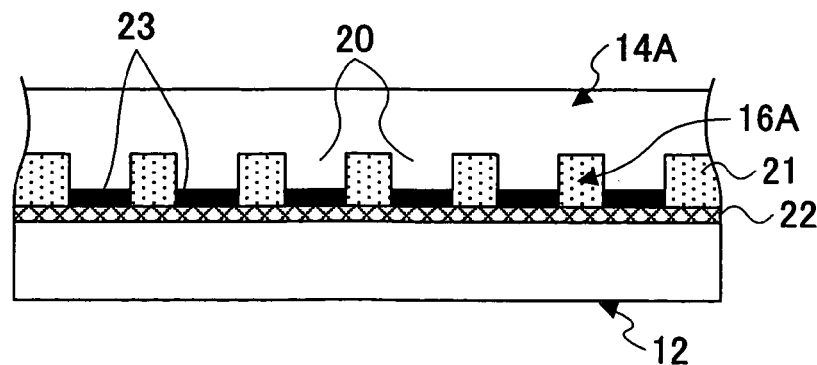

After these steps described above, the coupling member 16A is in such a state as thermally joined to the semiconductor chip 12 as shown in FIG. 5K. Also, the gaps between the posts 20 are securely filled with the resin material 21. In this manner, the method of manufacturing according to this embodiment simultaneously performs the metal-metal bonding process for joining the posts 20 to the metal layer 22 and the process of filling the gaps between the posts 20 with the resin material 21. The method of manufacturing the semiconductor device 10A can thus be simplified.

Figure 6A:
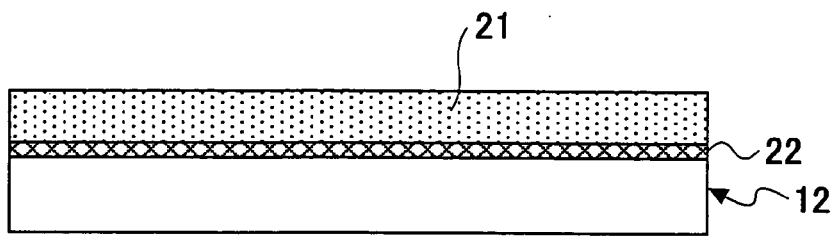
FIGS. 6A through 6C are illustrative drawings showing a variation of the method of manufacturing the semiconductor device of the invention.
Figure 6B:
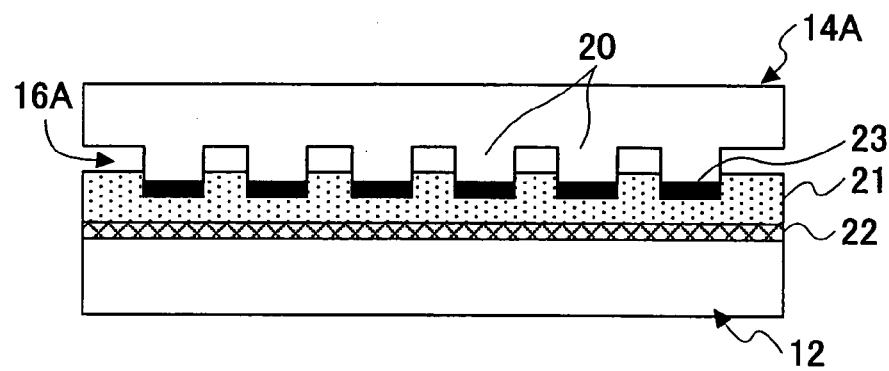
Figure 6C:
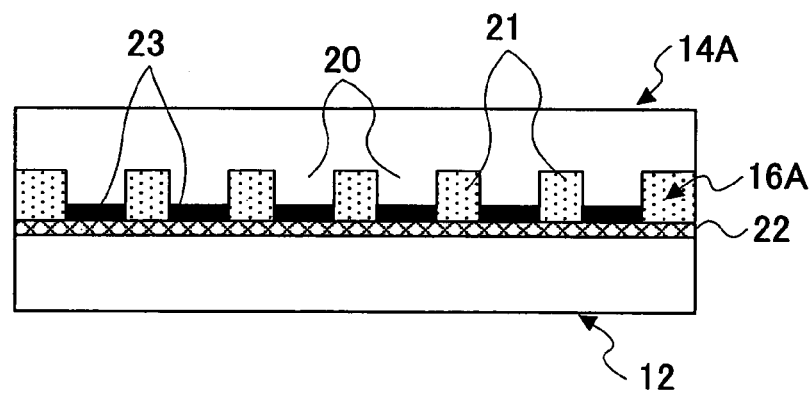

In the embodiment directed to the method of manufacturing as described above, the resin material 21 is temporarily fixed to the coupling member 16A first, followed by the provision of metal-metal bonding with the metal layer 22 formed on the back surface of the semiconductor chip 12. Alternatively, the resin material 21 may be temporarily fixed to the metal layer 22 formed on the semiconductor chip 12 as shown in FIG. 6A, followed by pressing the coupling member 16A against the semiconductor chip 12 under the heated condition as shown in FIG. 6B, thereby performing metal-metal bonding to join the posts 20 (the joint material 23) to the metal layer 22 as shown in FIG. 6C.

Moreover, the manufacturing method of this embodiment uses a sheet-like resin as the resin material 21. Alternatively, adhesive material in a gel state may be used as the resin material 21. When a gel adhesive material is used as the resin material 21, the adhesive material is designed to have low viscosity for second-time melting as in the case of the sheet-like resin material 21, and its viscosity changes significantly to approximately 5000 cps or smaller at a temperature above the temperature for temporal fixing. At the joining process in the case of using the gel adhesive material, the gel adhesive material is applied to the back surface of the semiconductor chip 12, and, then, the coupling member 16A is positioned relative to the semiconductor chip 12, followed by applying a pressure and heat to the semiconductor chip 12 and the coupling member 16A as in the case of the sheet-like resin material 21, thereby providing metal-metal bonding between the posts 20 and the metal layer 22.

In the manufacturing method according to this embodiment, Cu is grown by plating so as to serve as the posts 20. Alternatively, block members may be formed integrally on the heat dissipation member 14A in places where the posts 20 are to be provided, followed by a process of forming slits into the block member so as to form separate posts.

Figure 3:
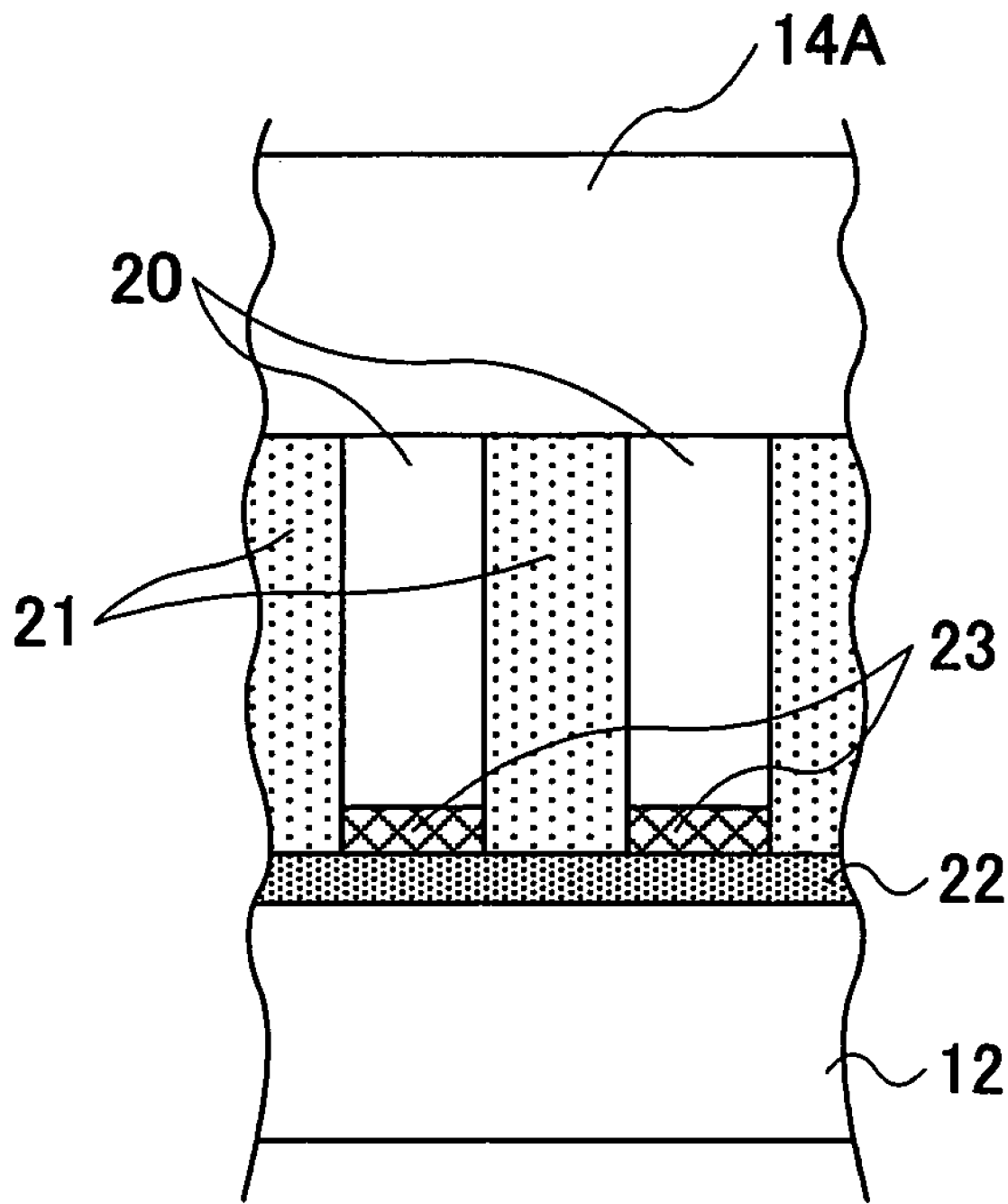
FIG. 3 is an expanded view of a portion where posts are provided in the semiconductor device of FIG. 2.

FIG. 7 through FIG. 11 show semiconductor devices 10B–10F according to second through sixth embodiments of the invention, respectively. In FIG. 7 through FIG. 11, the same elements as those of FIG. 2 through FIG. 4 are referred to by the same numerals, and a description thereof will be omitted.

Figure 7:
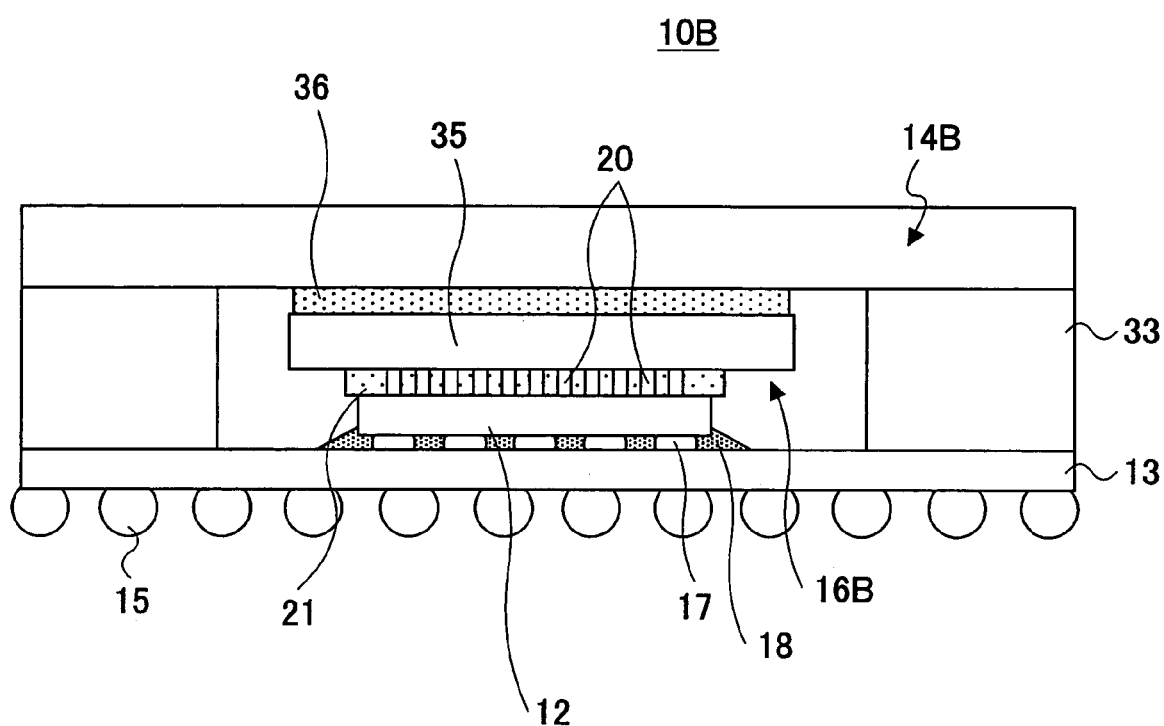
FIG. 7 is an illustrative drawing showing a semiconductor device according to a second embodiment.

FIG. 7 is an illustrative drawing showing the semiconductor device 10B according to the second embodiment. In the semiconductor device 10A according to the first embodiment previously described with reference to FIG. 2, the coupling member 16A is formed integrally with the heat dissipation member 14A. On the other hand, the semiconductor device 10B according to the second embodiment is constructed such that a coupling member 16B is a separate component from a heat dissipation member 14B.

The posts 20 are formed on a substrate 35, which is thermally coupled to the heat dissipation member 14B through a thermal conductor 36. The thermal conductor 36 is made of a material that has high thermal conductivity, and its coefficient of thermal expansion is set between the coefficient of thermal expansion of the heat dissipation member 14B and the coefficient of thermal expansion of the coupling member 16B.

With this provision, the coupling member 16B can be freely formed without regard to the heat dissipation member 14B. Even when the shape of the heat dissipation member 14B is modified, the coupling member 16B can thus be used without any modification.

Figure 8:
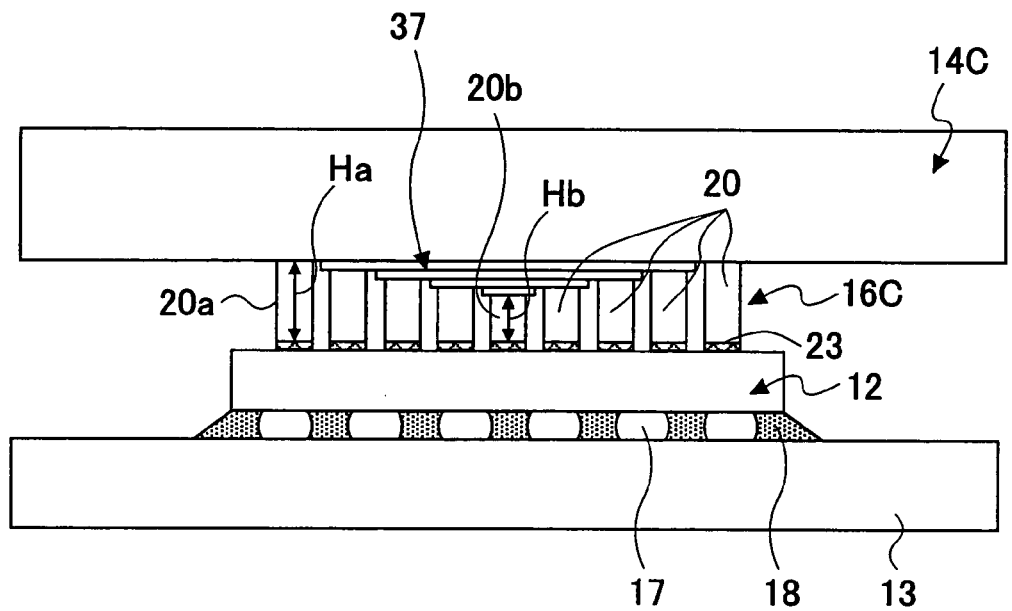
FIG. 8 is an illustrative drawing showing a semiconductor device according to a third embodiment.

FIG. 8 is an illustrative drawing showing the semiconductor device 10C according to the third embodiment. The semiconductor device 10C according to this embodiment is characterized in that the posts 20 constituting a coupling member 16C have different heights. Specifically, steps 37 are formed on a heat dissipation member 14C, so that the lengths of the posts 20 near the center (the length of a post 20$b$ situated at the center is shown by an arrow Hb) are shorter than the lengths of the posts 20 near the perimeter (the length of a post 20$a$ situated at the perimeter is shown by an arrow Ha) That is, Ha>Hb.

Figure 9:
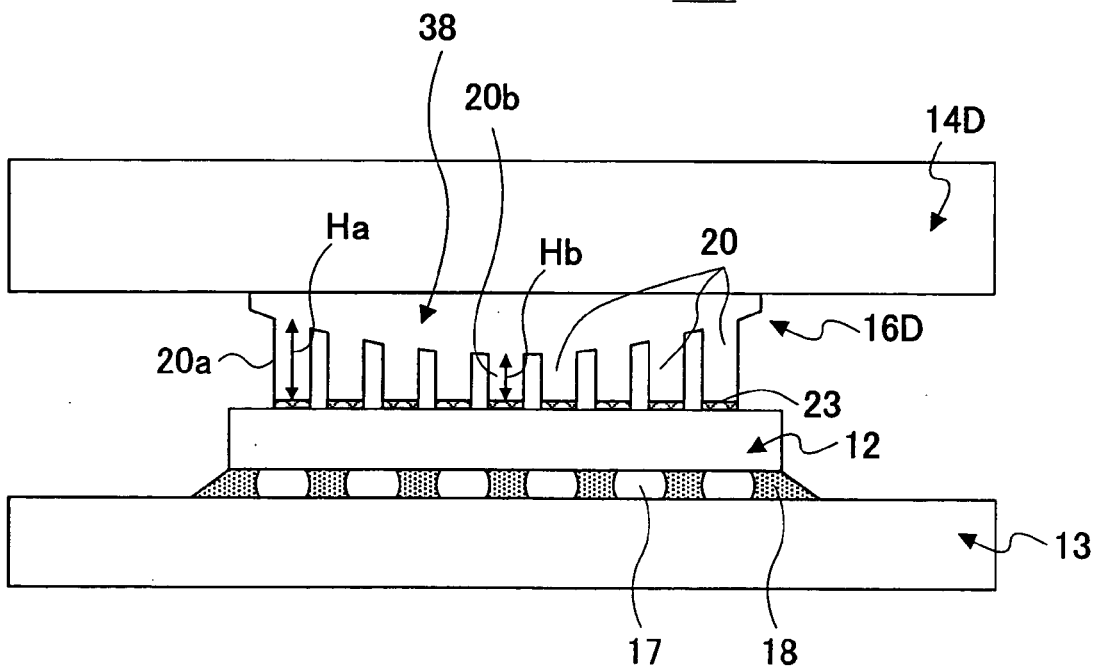
FIG. 9 is an illustrative drawing showing a semiconductor device according to a fourth embodiment.

FIG. 9 is an illustrative drawing showing the semiconductor device 10D according to the fourth embodiment. Like the semiconductor device 10C of the third embodiment, the semiconductor device 10D of the fourth embodiment has the posts 20 constituting a coupling member 16D and having different heights.

Specifically, a spherical member 38 is formed on a heat dissipation member 14D, so that the lengths of the posts 20 near the center (the length of a post 20$b$ situated at the center is shown by an arrow Hb) are shorter than the lengths of the posts 20 near the perimeter (the length of a post 20$a$ situated at the perimeter is shown by an arrow Ha). That is, Ha>Hb. The changes in the length of the posts 20 may be gradual from the center toward the perimeter, or may be stepwise.

Figure 10:
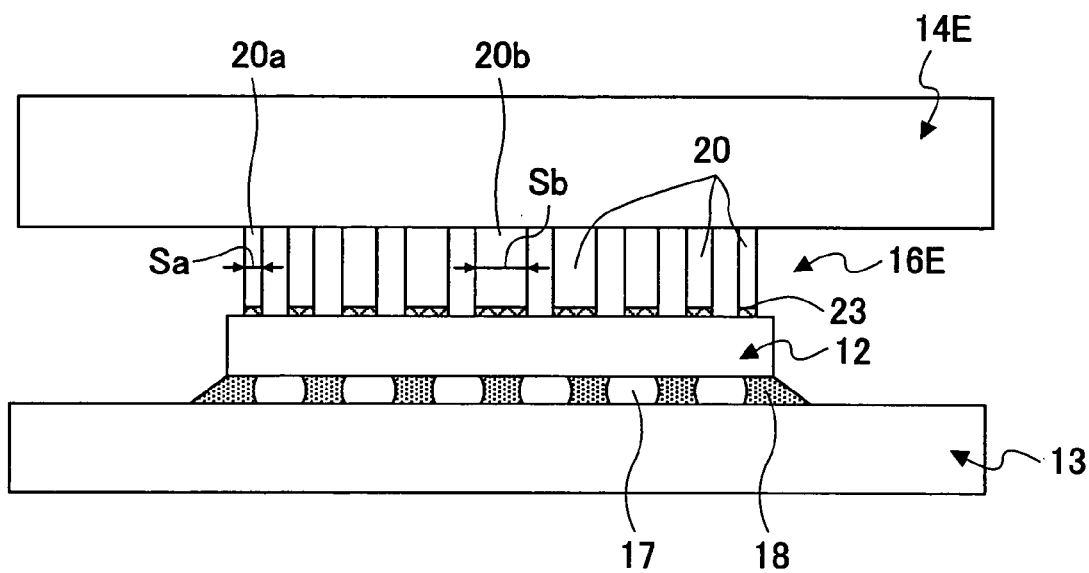
FIG. 10 is an illustrative drawing showing a semiconductor device according to a fifth embodiment.

FIG. 10 is an illustrative drawing showing the semiconductor device 10E according to the fifth embodiment. The semiconductor device 10E according to this embodiment is characterized in that the posts 20 constituting a coupling member 16E have different cross-sectional areas.

Specifically, the cross-sectional areas of the posts 20 near the center (the cross-sectional area of a post 20$b$ situated at the center is represented by Sb) are larger than the cross-sectional areas of the posts 20 near the perimeter (the cross-sectional area of a post 20$a$ situated at the perimeter is represented by Sa). That is, Sa<Sb. The changes in the cross-sectional area of the posts 20 may be gradual from the center toward the perimeter, or may be stepwise.

Figure 11:
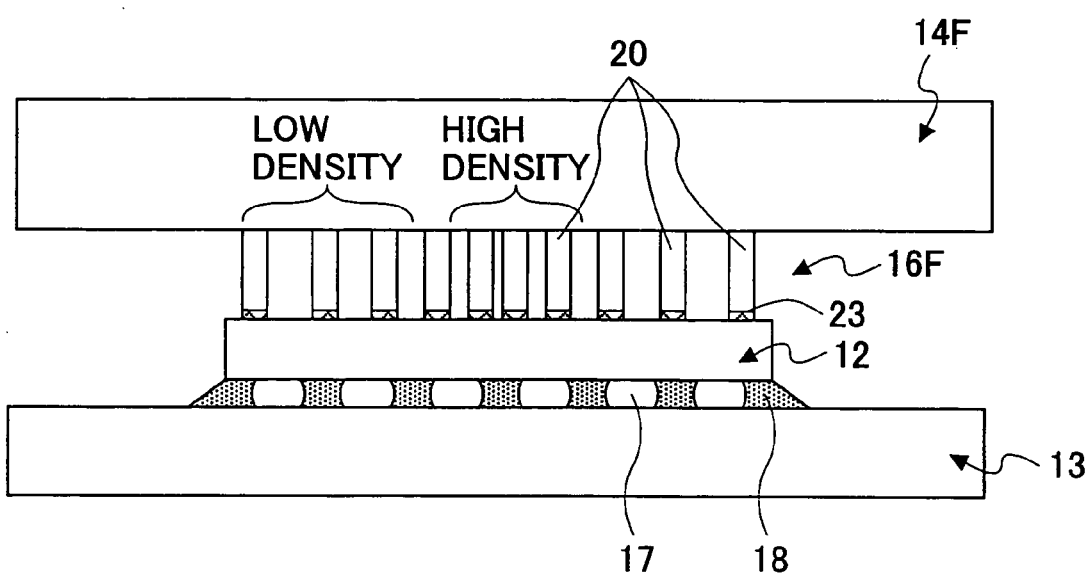
FIG. 11 is an illustrative drawing showing a semiconductor device according to a sixth embodiment.

FIG. 11 is an illustrative drawing showing a semiconductor device 10F according to the sixth embodiment. The semiconductor device 10F according to this embodiment is characterized in that the posts 20 constituting a coupling member 16F have the same height and cross-sectional areas, but are arranged with varying layout density.

Specifically, the layout density of the posts 20 near the center is higher than the layout density of the posts 20 near the perimeter. The changes in the layout density of the posts 20 may be gradual from the center toward the perimeter, or may be stepwise.

The semiconductor devices 10B–10F according to the second through sixth embodiments described above have higher rigidity near the center where a smaller stress is generated, and have lower rigidity to provide elasticity near the perimeter where a larger stress is generated. When a relative displacement between the semiconductor chip 12 and the heat dissipation member 14B–14F is generated due to different thermal expansion, such displacement increases toward the perimeter. As a result, a stress applied between the semiconductor chip 12 and the heat dissipation member 14B–14F also increases toward the perimeter.

The semiconductor device 10B–10F according to the second through sixth embodiments has higher rigidity near the center, and has lower rigidity near the perimeter of the coupling member 16B–16F so as to easily bend. With this provision, a stress generated between the semiconductor chip 12 and the heat dissipation member 14B–14F is efficiently absorbed in a reliable manner by the coupling member 16B–16F.

Further, the present invention is not limited to these embodiments, but various variations and modifications may be made without departing from the scope of the present invention.

What is claimed is:

1. A semiconductor device, comprising:
    a semiconductor chip;
    a heat dissipation member for dissipating heat generated by said semiconductor chip; and
    a coupling member which thermally couples said semiconductor chip to said heat dissipation member,
    wherein said coupling member is made of metal and deformable to absorb a stress generated between said semiconductor chip and said heat dissipation member, said coupling member and said semiconductor chip being joined through metal-metal bonding.

2. The semiconductor device as claimed in claim 1, further comprising a metal layer formed on said semiconductor chip in a place where said coupling member is joined to said semiconductor chip through the metal-metal bonding.

3. The semiconductor device as claimed in claim 1, wherein said coupling member includes a plurality of posts that are deformable.

4. The semiconductor device as claimed in claim 3, further comprising an organic material filling gaps between said posts.

5. The semiconductor device as claimed in claim 4, wherein said organic material is mixed with an inorganic material, the mixture of said organic material and said inorganic material having a coefficient of thermal expansion between a coefficient of thermal expansion of said semiconductor chip and a coefficient of thermal expansion of said heat dissipation member.

6. The semiconductor device as claimed in claim 3, wherein said posts have varying lengths, which are longer at a perimeter than at a center of said coupling member.

7. The semiconductor device as claimed in claim 3, wherein said posts have varying cross-sectional areas, which are smaller at a perimeter than at a center of said coupling member.

8. The semiconductor device as claimed in claim 3, wherein said posts arranged with varying layout density, which is lower at a perimeter than at a center of said coupling member.

9. The semiconductor device as claimed in claim 1, wherein said coupling member is integral with said heat dissipation member.

* * * * *